Nov. 28, 1961 J. H. VOGELSONG 3,011,066

TRANSISTOR AMPLIFIER CIRCUIT WITH FEEDBACK CONTROL MEANS

Filed June 17, 1954

INVENTOR
J. H. VOGELSONG
BY [signature]
ATTORNEY

3,011,066
TRANSISTOR AMPLIFIER CIRCUIT WITH FEEDBACK CONTROL MEANS

James H. Vogelsong, Madison, N.J., assignor to Bell Telephone Laboratories, Incorporated, New York, N.Y., a corporation of New York Filed June 17, 1954, Ser. No. 437,401
15 Claims. (Cl. 307—88.5)

Figure 1:
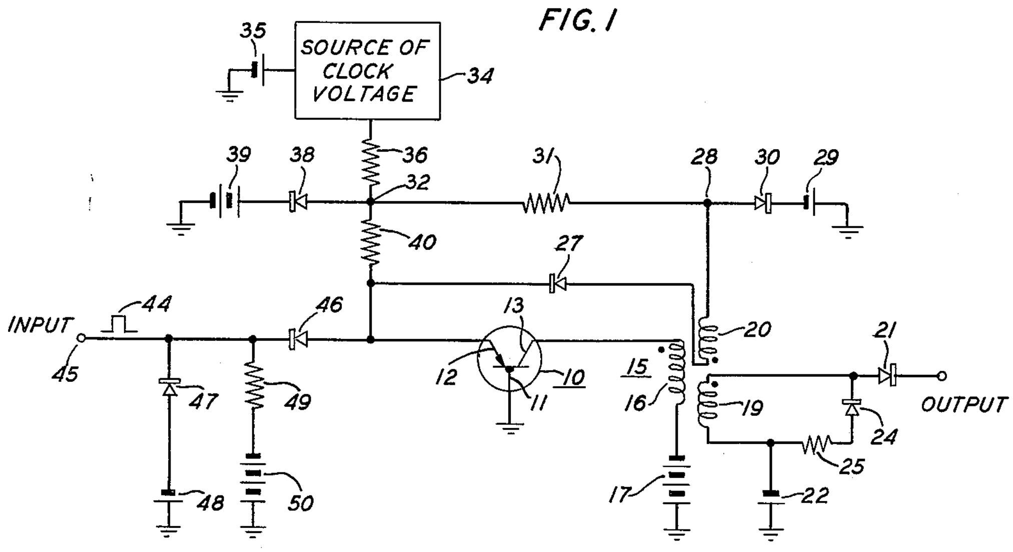

This invention relates to electrical circuits and more particularly to transistor amplifier circuits.

Transistor pulse amplifiers are often employed in electrical systems, such as synchronous digital computers wherein the logical operations are performed by germanium or other type diode circuits, to regenerate the positive information pulses in amplitude, time and shape. In my application Serial No. 372,897, filed August 7, 1953, now United States Patent No. 2,835,828, issued May 20, 1958, there is described a transistor pulse amplifier using regenerative feedback, employing feedback external to the transistor itself for the retiming of the pulses. The feedback voltage is applied, together with the input pulse, to a diode gate which applies a pulse to the emitter of the transistor under control of a timed clock pulse.

In the devices disclosed in applications Serial No. 437,458, filed June 17, 1954, of J. H. Felker and Serial No. 437,457, filed June 17, 1954, of Q. W. Simkins, now Patent 2,802,117, granted August 6, 1957, positive gain is realized by using a gated feedback circuit in which the feedback current is applied directly to the emitter of the transistor through a diode which is biased in the forward direction during the initial build up of current through the transistor so that the feedback winding of the output transformer sees a low impedance initially but a high impedance when the diode is back-biased after the feedback current has reached a predetermined level. Additionally, the load is connected to a distinct secondary winding of the output transformer and there is placed in series therewith a diode which is back-biased during initial build up of the current through the transistor so that the collector is isolated from the load during this interval.

It is an object of this invention to provide an improved regenerative transistor amplifier circuit having two distinct feedback operations whereby the advantages of the gated initial current build up may be attained with linear feedback operation after the build up of the current.

It is another object of this invention to reduce the number of components in regenerative transistor amplifier circuits and to simplify such circuits.

These and other objects of this invention are attained in specific embodiments wherein the feedback current is applied through a resistor from a source, the current flowing through the resistor, the feedback winding and a diode. A diode having a clamping potential applied thereto is connected to a point between the resistor and the feedback winding. When the feedback current initially starts to flow, the aforementioned point is held at a specified potential by the clamping potential and the operation of the circuit is similar to the gated feedback described in the above-mentioned Simkins application. However, as the feedback current builds up, the voltage drop across the resistor in the feedback circuit becomes large enough so that the diode is back-biased and the clamping potential removed, after which the operation of the feedback circuit is linear, a change in output voltage being reflected by a concomitant change in the feedback current.

Before the change-over in operation, the feedback winding sees essentially the low impedance of the forward resistances of two diodes and the impedance of the emitter of the transistor; after the change-over the impedance includes in place of the forward resistance of one of the diodes the resistance of the resistor connected in the feedback circuit.

It is a feature of this invention that the feedback circuit of a transistor amplifier include a diode and a resistor, each connected to one end of a feedback winding of an output transformer, the diode being biased by a source connected thereto to be biased in its forward direction when a small current is flowing through the resistor from a source but to be blocked when a larger current is flowing through the resistor, thereby increasing the voltage drop thereacross.

It is a further feature of this invention that the feedback winding of an output transformer of a transistor amplifier circuit be connected to a small impedance during the build up of current through the transistor, when the feedback is gated, and to a substantially larger impedance after build up of current, when the feedback is linear. Thus initially the output voltage is low while the current builds up; then the output voltage builds up while the emitter current also builds up due to linear feedback.

A complete understanding of this invention and of the various features thereof may be gained from consideration of the following detailed description and the accompanying drawing, the two figures of which are schematic representations of two specific illustrative embodiments of this invention.

Turning now to the drawing, the specific illustrative embodiment of this invention depicted in FIG. 1 comprises a transistor 10, which may advantageously be a cartridge type point contact transistor of the type disclosed in Patent 2,524,035, issued October 3, 1950, to J. Bardeen and W. H. Brattain. The transistor has a grounded base 11, an emitter 12, and a collector 13, as is known in the art. Reference may be made to my application Serial No. 372,897, filed August 7, 1953, now United States Patent 2,835,828, issued May 20, 1958, and to my article "A Transistor Pulse Amplifier Using External Regeneration," volume 41, page 1444 of the Proceedings of the I.R.E. (1953) wherein a prior type of transistor amplifier circuit employing external regeneration is disclosed, for a discussion of the characteristics of transistors of one type that may advantageously be employed in circuits in accordance with this invention.

An output transformer 15 has a primary winding 16 connected to the collector 13 and is biased as by a source 17 of negative potential. Transformer 15 also has two secondary windings including a load winding 19 and a feedback winding 20. A diode 21 is connected in series with the load winding 19 and slightly back-biased by a source 22 of negative potential to isolate the load from the collector circuit during build up of current through the transistor, as further described in application Serial No. 437,457, filed June 17, 1954, of Q. W. Simkins, now Patent 2,802,118, granted August 6, 1957. A diode 24 and a resistor 25 may be connected across the load winding 19, if desired, to aid in the dissipation of the energy in the mutual inductance of the transformer in the interval between output pulses.

The feedback winding 20 is connected directly to the emitter 12 through a diode 27 and the winding is so arranged that when a positive pulse appears at the collector 13, the potential induced across the winding 20 is positive at diode 27; this is indicated by the dots adjacent the various windings of the transformer 15 in accordance with a notation known in the art. The other end of the winding 20 is identified as point 28 on the drawing, is initially held at a fixed potential by a source 29 through a diode 30, and is also connected through a resistor 31 to point 32. A source 34 of clock voltage, which is biased at a slight direct current potential by a source 35, is connected to the point 32 through a resistor 36, and a clipping circuit comprising diode 38 and a source 39 is also connected to point 32. A resistor 40 connects the point 32 to the emitter 12 of the transistor 10.

Each of the diodes mentioned herein may advantageously be of germanium or other semiconductor material, though other unidirectional or asymmetrically conducting elements may be employed, as is known in the art.

The input pulse 44 is applied to an input terminal 45 and through a diode 46 to the emitter 12. A diode 47 biased by a negative source 48 is connected to the input terminal 45 as is a resistor 49 biased by a negative source 50.

The operation of this circuit and particularly of the feedback loop can best be understood by describing the operation first when no input pulse 44 is present and then to note the change in its functioning when an input pulse 44 is present.

During the interval when the applied clock voltage from source 34 is more negative than the biasing source 29 connected to diode 30, with respect to ground, the diodes 30 and 27 are back-biased. As the clock becomes less negative and reaches approximately the voltage of source 29, current commences to flow through resistor 36. This current divides at point 32, and in the specific embodiment for which the circuit parameters are given below, one-fourth the current goes through resistor 40 and three-fourths through resistor 31 and diode 30 to the source 29. The one-fourth current goes through resistor 40, diode 46, and resistor 49 to source 50. The current in resistor 31 increases to a certain maximum, which was 5.5 milliamperes in this specific embodiment, where it remains while the positive peak of the clock voltage wave is clipped by diode 38 connected to point 32. As the clock wave voltage decreases, this current decreases steadily until it becomes zero for applied clock voltages more negative than the voltage of source 29. It should be noted that diode 27 is in a neutral state, with perhaps just a slight forward bias, during the period when the clock is more positive than the voltage of source 29.

When an input signal 44 is applied to the input terminal 45, the feedback operation in accordance with this invention is somewhat more involved. While the clock source 34 remains more negative than the source 29 the performance is as before. As the clock reaches the voltage of source 29, current again commences to flow from the source 34 through resistor 36 to point 32; but this time it does not divide immediately as the presence of the input pulse 44 prevents current flowing through diode 46. For the short interval until the potential at point 32 reaches the break point of the transistor, i.e., the point in the emitter characteristic at which the transistor comes out of cut off, all of this current flows through resistor 31 and diode 30. When the current reaches a predetermined but low value, which was 1.0 milliampere in the embodiment whose parameters are listed below, the point 32 reaches the break point potential so that current from point 32 begins to flow to the transistor emitter 12 through resistor 40. As the clock voltage continues to rise toward the clamping level, the currents through both resistors 31 and 40 increase. The current through resistor 40, which in the specific embodiment described levels off at approximately 1.5 milliamperes, is the trigger current responsible for the initial current in the collector 13. This collector current, modified by the transformer turns ratio, which may typically be 3:1, is fed back to the emitter through the diode 27. As long as the current gain around the loop exceeds unity, therefore, emitter and collector currents increase with no increase in the external drive.

As can be seen in FIG. 1, the source of current through diode 27 and the transformer feedback winding 20 is the same as that for the current through the diode 30, namely, the clock source 34 through resistors 36 and 31. In fact, the current through diode 27 represents a diversion of current from diode 30 as a result of a relatively small voltage induced in the feedback winding 20; one may also consider that the gated feedback current flows from the source 29. Specifically this relatively small voltage is the difference between the potentials at the emitter 12 and at point 28, in addition to the forward drop across diode 27; in the specific embodiment being described this amounted to a total of about 1.5 volts. Until the current through diode 27 increases to a sufficiently high value, such as 6.0 milliamperes in this embodiment, the point 28 is clamped to the voltage of source 29, which may be 1.0 volt, through the low forward impedance of diode 30. The voltage at point 32 is also held at a value slightly in excess of that of source 39 through the diode 38; accordingly the current through diode 27 is limited by the voltage drop across resistor 31 and the value of resistor 31 until diode 30 is cut off. When diode 30 is cut off by forcing more current through resistor 31 the point 28 becomes more negative than the source 29 and a second stage of the feedback begins, distinct in operation from that described above in which the feedback operation is a form of gated feedback.

After the diode 30 has been cut off the incremental feedback becomes linear in nature. Each additional volt across the feedback winding produces an additional milliampere of feedback current, in this specific embodiment in which resistor 31 is a thousand ohms. Since the input impedance at the emitter is low compared to the resistance value of resistor 31, the additional voltage is evidenced primarily by a drop in potential at point 28 rather than as a rise at the emitter. Typically point 28 may drop to −5 volts with respect to ground in this specific embodiment. The build up of feedback is terminated by the collector being driven to saturation.

To aid the establishment of the full feedback current diode 21 is normally back-biased by about −1.5 volts by source 22, as in the gated feedback circuits described in the above-mentioned Simkins application. This prevents the load from effectively drawing current from the feedback loop until an appreciable feedback current is provided. The current gain in the loop might otherwise be reduced to the extent that a full output pulse could not be produced. Many of the non-linear loads to be driven by a transistor amplifier of the type of this invention present a very low incremental impedance and thereby aggravate this condition. It is therefore sometimes desirable to limit the ratio of linear-to-gated feedback in circuits in accordance with this invention. Some linear feedback may be utilized to compensate for the build up of magnetizing current in the coupling transformers since this quantity is greatest at the end of the pulse interval, and is essentially zero at the start. The build up of magnetizing current should not be allowed to bring the transistor collector appreciably out of saturation before the end of the pulse interval, however. When this occurs the pulse voltage "rolls off." With linear feedback, emitter curernt is decreased by shrinkage of the pulse, and the decrease in emitter current acts to reduce the pulse still more.

Decreasing the linear-to-gated feedback ratio in the embodiment of FIG. 1 requires increasing the clock power. In the embodiment of this invention depicted in FIG. 2, however, the ratio is a function of the direct current, rather than clock, power. In this embodiment the feedback current is from source 52 through resistor 53, when the clock source 54 back-biases the diode 55, to the point 28, and thence through feedback winding 20 and diode 27 to the emitter 12, as in the prior embodiment. The linear-to-gated feedback ratio in this embodiment can be made smaller by increasing the voltage of source 52 and thereby increasing the current flow through resistor 53 required to attain cut off of diode 30. In each embodiment, however, the feedback is of one type, referred to as gated, until the current from the feedback current source is sufficiently large so that the voltage drop across a resistor back-biases the diode 30, after which the feedback is of the second type, referred to as linear.

The input pulse 44 is gated by the clock source 54 which is connected to the emitter through a diode 57; a voltage source 60 and resistor 61 are also connected to the emitter 12 so that in the absence of an input pulse current flows from source 60 to source 50, as described above for the embodiment of FIG. 1.

Figure 2:
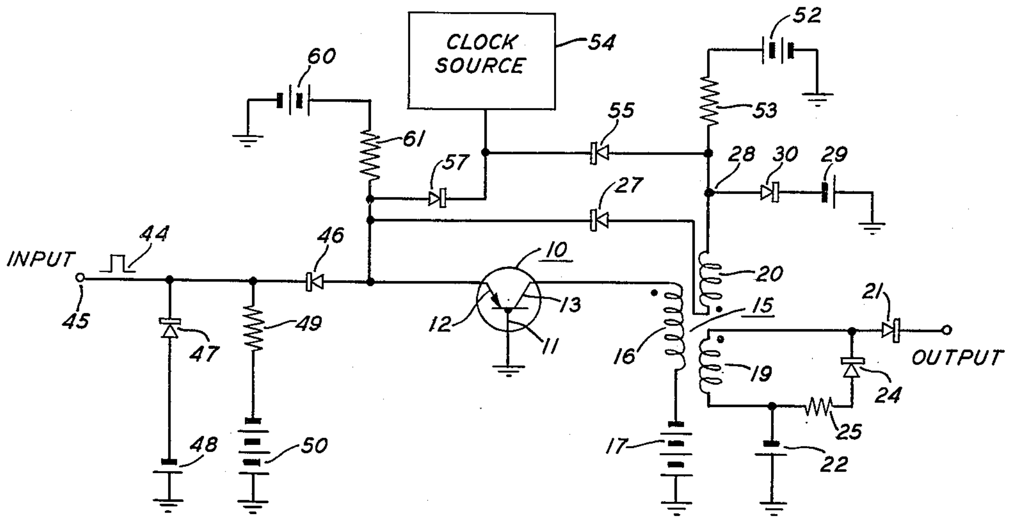

Although the trigger and feedback currents in the embodiment of FIG. 2 are supplied from direct current voltage sources 60 and 52, respectively, the basic performance of the feedback circuit is similar to that of the embodiment of FIG. 1.

In one specific illustrative embodiment of this invention in accordance with FIG. 1 the various circuit parameters had the following values which are to be considered as merely illustrative:

| | |
|---|---|
| Resistor **25** | 1,200 ohms. |
| Resistor **31** | 1,000 ohms. |
| Resistor **36** | 200 ohms. |
| Resistor **40** | 3,000 ohms. |
| Resistor **49** | 7,500 ohms. |
| Source **17** | —20 volts. |
| Source **22** | —3 volts. |
| Source **29** | —1 volt. |
| Source **35** | 2 volts. |
| Source **39** | 4.5 volts. |
| Source **48** | —1 volt. |
| Source **50** | —20 volts. |
| Pulse power gain | 10 to 12 db. |
| (Max.) pulse input power | 7 milliwatts. |
| Clock power dissipation | 40 milliwatts. |
| D.C. power dissipation (idle condition) | 100 milliwatts. |

The clock source 34 has a frequency of 3 megacycles and a swing of 15 volts peak-to-peak, superimposed on the 2 volt bias of source 35.

It is to be understood that the above-described arrangements are illustrative of the application of the principles of the invention. Numerous other arrangements may be devised by those skilled in the art without departing from the spirit and scope of the invention.

What is claimed is:

1. An amplifier circuit comprising a transistor having an emitter, a base and a collector, an external feedback circuit connecting said collector to said emitter and including a primary winding of a transformer, a feedback secondary winding of said transformer having one end connected to said emitter, and a diode and a resistor connected to the other end of said feedback winding, means biasing said diode to maintain said other end at a predetermined voltage during initial flow of feedback current in said feedback circuit, and means supplying current through said resistor whereby the voltage drop across said resistor is sufficient to back-bias said diode following said initial flow of current in said feedback circuit.

2. An amplifier circuit comprising a transistor having an emitter, a base and a collector, an output transformer having a primary winding connected to said collector, a feedback circuit connecting said collector to said emitter and including a feedback secondary winding of said transformer, means for maintaining the voltage of one end of said feedback winding constant during initial flow of current in said feedback winding, and means for allowing said voltage at said one end of said feedback winding to decrease following said initial flow of current in said feedback winding, whereby linear feedback is attained only following said initial flow of current.

3. An amplifier circuit comprising a transistor having an emitter, a base and a collector, an output transformer having a primary winding connected to said collector, a feedback circuit connecting said collector to said emitter and including a feedback secondary winding of said transformer having one end connected to said emitter, a diode connected to the other end of said feedback winding, means including said diode for maintaining the voltage at said other end at a predetermined value during initial flow of feedback current in said feedback circuit, an impedance connected to said other end, and means including a source of voltage connected to said impedance for causing current to flow in said impedance to back-bias said diode and depress the voltage at said other end, whereby the operation of said feedback circuit is linear only after said diode is back-biased.

4. An amplifier in accordance with claim 3 wherein said transformer also includes a load secondary winding, a diode connected to said load winding, and means including said last-mentioned diode for preventing passage of current through said load winding during said initial flow of feedback current in said feedback circuit.

5. An amplifier in accordance with claim 3 wherein said source of voltage comprises a source of clock frequency voltage.

6. An amplifier in accordance with claim 3 wherein said source of voltage comprises a source of direct current voltage.

7. An amplifier circuit comprising a transistor having a base, a collector and an emitter, an output transformer having a primary winding connected to said collector, a feedback secondary winding of said transformer, means connecting said feedback winding to said emitter, means determining the flow of current through said feedback winding to said emitter during initial build up of current through said transistor, and means for disabling said last means and causing current to flow through said feedback winding to said emitter in substantial linear relationship with the voltage across said transformer following said initial build up of current through said transistor.

8. An amplifier circuit in accordance with claim 7 wherein said current determining means includes a diode connected to said feedback winding and means biasing said diode, whereby the voltage at the connection between said feedback winding and said diode during said build up of current through said transistor is a constant.

9. An amplifier circuit in accordance with claim 8 wherein said disabling and current means includes an impedance connected to said connection between said diode and said feedback winding and means for causing current to flow through said impedance whereby the voltage drop across said impedance is sufficient to depress the voltage at said connection and back-bias said diode.

10. An amplifier circuit in accordance with claim 9 further comprising means for maintaining a constant potential at the end of said impedance removed from said connection.

11. An amplifier circuit in accordance with claim 9 wherein said impedance is a resistance.

12. An amplifier circuit comprising a transistor having an emitter, a base, and a collector, current feedback circuit means for applying increased amounts of current from said collector to said emitter in response to initial increments of current applied to said emitter, said feedback circuit means including a primary winding of a transformer and a feedback secondary winding of said transformer having one end connected to said emitter, a diode and a resistor connected to the other end of said feedback winding, means biasing said diode to maintain said other end at a predetermined voltage during initial flow of feedback current in said feedback circuit means, and means supplying current through said resistor whereby the voltage drop across said resistor is sufficient to back-bias said diode following said initial flow of current in said feedback circuit means.

13. An amplifier circuit as defined in claim 12 wherein said feedback circuit means includes an additional diode connected between said one end of said feedback winding and said emitter, and wherein said additional diode is poled in the same direction as the emitter to base rectifying circuit of said transistor.

14. In an amplifying system, an input, an amplifier having an output, feedback means fed by said output, said feedback means including means responsive to an increase in signal output of the amplifier for momentarily passing a large percentage of the said signal output and for thereafter passing a smaller percentage of said signal output as a feedback signal, and means fed by said input and by said feedback means for energizing the input of the amplifier, said last-named means including means that periodically interrupts the flow of feedback signals.

15. An amplifying system as defined in claim 1 in which the last-named means interrupts the feedback signals as well as the flow of any signals from said input to said amplifier.

References Cited in the file of this patent

UNITED STATES PATENTS

| | | |
|---|---|---|
| 2,556,286 | Meacham | June 12, 1951 |
| 2,644,893 | Gehman | July 7, 1953 |
| 2,797,261 | Polyzou | June 25, 1957 |

FOREIGN PATENTS

| | | |
|---|---|---|
| 161,655 | Australia | Oct. 29, 1953 |